(12) United States Patent
Hasegawa et al.

(10) Patent No.: US 10,746,893 B2
(45) Date of Patent: Aug. 18, 2020

(54) PROXIMITY SENSOR (71) Applicant: OMRON Corporation, Kyoto (JP)

(72) Inventors: Ryota Hasegawa, Ayabe (JP); Hiroyuki Tsuchida, Ayabe (JP); Kazuaki Miyamoto, Fukuchiyama (JP); Yusuke Hayashi, Kameoka (JP); Kenji Matsuoka, Moriyama (JP)

(73) Assignee: OMRON Corporation, Kyoto (JP)

(*) Notice: Subject to any disclaimer, the term of this patent is extended or adjusted under 35 U.S.C. 154(b) by 155 days.

(21) Appl. No.: 15/892,349

(22) Filed: Feb. 8, 2018

(65) Prior Publication Data

US 2019/0094404 A1    Mar. 28, 2019

(30) Foreign Application Priority Data

Sep. 25, 2017   (JP) ................. 2017-183371

(51) Int. Cl.
    *G01B 7/00*   (2006.01)
    *G01V 3/10*   (2006.01)
    (Continued)

(52) U.S. Cl.
    CPC .............. *G01V 3/10* (2013.01); *G01V 3/38* (2013.01); *H03K 17/9505* (2013.01); *H03K 17/9537* (2013.01)

(58) Field of Classification Search
    CPC ...... G01D 5/20; G01D 5/2006; G01D 5/2216; G01D 5/243; G01D 5/2053; G01D 5/244;
    (Continued)

(56) References Cited

U.S. PATENT DOCUMENTS 4,879,512 A * 11/1989 Leonard ................ G01B 7/023
    324/207.16
6,215,365 B1 * 4/2001 Kurkovskiy ........... H03K 3/014
    324/236

(Continued)

FOREIGN PATENT DOCUMENTS

JP    H01233913    9/1989
JP    H05218845    8/1993

(Continued)

OTHER PUBLICATIONS

"Office Action of Korea Counterpart Application," dated Dec. 28, 2018, with English translation thereof, p. 1-p. 9.

*Primary Examiner* — Thang X Le
(74) *Attorney, Agent, or Firm* — JCIPRNET (57) ABSTRACT

A proximity sensor that outputs presence or absence of a detection object or a position of the detection object as a detection result includes: a detection part configured to include a detection coil and a capacitor; an oscillation circuit configured to excite the detection part; an analog/digital conversion circuit configured to detect a signal change occurring in the detection part and output a digital signal indicating the detected signal change; a temperature detection part configured to detect a temperature inside a casing of the proximity sensor; a storage part configured to store a characteristic parameter unique to the proximity sensor in advance; a control calculation part configured to process a digital signal from the analog/digital conversion circuit to calculate a signal indicating a distance to the detection object, compensate the calculated signal using the characteristics parameter stored in the storage part, and output the compensated signal as the detection result.

17 Claims, 9 Drawing Sheets (51) Int. Cl.
*H03K 17/95* (2006.01)
*G01V 3/38* (2006.01)

(58) Field of Classification Search
CPC ........... G01D 5/24476; G01D 5/24404; G01D 5/24461; G01D 5/208; G01D 5/12; G01D 5/2046; G01D 5/2086; G01D 5/145; G01D 5/2451; G01D 3/036; G01D 3/0365; G01V 3/10; G01V 3/38; G01R 27/02; G01R 27/2611; G01R 27/28; G01B 7/003
See application file for complete search history.

(56) References Cited

U.S. PATENT DOCUMENTS

| | | | | |
|---|---|---|---|---|
| 6,819,100 B2 * | 11/2004 | Iida | ........................ | G01D 3/022 324/207.12 |
| 2006/0164075 A1 * | 7/2006 | Niwa | .................... | G01D 3/0365 324/207.16 |
| 2008/0054905 A1 * | 3/2008 | Linse | ..................... | G01V 3/101 324/326 |
| 2009/0091314 A1 * | 4/2009 | Karenowska | ............ | G01D 5/20 324/207.16 |
| 2013/0271158 A1 * | 10/2013 | Thoss | ...................... | G01B 7/14 324/654 |
| 2016/0372980 A1 * | 12/2016 | Lannoije | ................. | H02J 17/00 |
| 2017/0248443 A1 * | 8/2017 | Hrubes | .................... | G01D 5/20 |

FOREIGN PATENT DOCUMENTS

| | | |
|---|---|---|
| JP | H0888555 | 4/1996 |
| JP | 2010045532 | 2/2010 |
| KR | 20100033201 | 3/2010 |

* cited by examiner

| | CONNECTION CH: 01 | Serial No. :158397 | |
|---|---|---|---|
| | INTERNAL CHAMBER TEMPERATURE | INTERNAL CASING TEMPERATURE | DETECTED VALUE |
| 1 | 60 | 65.8 | 2550 |
| 2 | 80 | 87.9 | 2568 |
| 3 | 100 | 112.3 | 2589 |
| 4 | 120 | 135.5 | 2615 |
| 5 | 140 | 154.6 | 2659 |

FIG. 10

PROXIMITY SENSOR

CROSS-REFERENCE TO RELATED APPLICATION

This application claims the priority of Japan patent application serial no. 2017-183371, filed on Sep. 25, 2017. The entirety of the above-mentioned patent application is hereby incorporated by reference herein and made a part of this specification.

BACKGROUND

Technical Field

The disclosure relates to a proximity sensor.

Description of Related Art

In fields of factory automation (FA) technologies, proximity sensors outputting presence or absence of a detection object or a distance to a detection object as a detection result are used. For proximity sensors, a plurality of detection schemes have been proposed. For example, in high frequency oscillation type proximity sensors, high frequency waves are radiated from primary coils and detection is executed based on changes in waveforms occurring in secondary coils (which are common to the primary coils in some cases).

For such proximity sensors, for example, Japanese Unexamined Patent Application Publication No. H05-218845 (Patent Document 1) discloses a configuration in which a programming unit is mounted in order to adjust a proximity switch in accordance with a desired operation distance.

Detection characteristics of the proximity sensors are affected due to a change in an ambient temperature are known. For example, Japanese Unexamined Patent Application Publication No. H01-233913 (Patent Document 2) discloses a learning type temperature compensation circuit.

[Patent Document 1] Japanese Unexamined Patent Application Publication No. H05-218845

[Patent Document 2] Japanese Unexamined Patent Application Publication No. H01-233913

There is a request for improving detection precision of a proximity sensor or expanding a detectable range of the proximity sensor. In the configuration disclosed in Japanese Unexamined Patent Application Publication No. H05-218845 (Patent Document 1), an operation distance of an individual proximity switch can be set. However, in such a configuration, the above-described request may not be satisfied.

In Japanese Unexamined Patent Application Publication No. H01-233913 (Patent Document 2), the detection precision can be improved by the temperature compensation circuit. However, an influence of a variation in component characteristics or a manufacturing process may not be reduced.

SUMMARY

The disclosure is to provide a proximity sensor capable of improving detection precision or expanding a detectable range.

According to an embodiment of the disclosure, there is provided a proximity sensor that outputs presence or absence of a detection object or a position of the detection object as a detection result. The proximity sensor includes: a detection part configured to include a detection coil and a capacitor; an oscillation circuit configured to excite the detection part; an analog/digital conversion circuit configured to detect a signal change occurring in the detection part and output a digital signal indicating the detected signal change; a temperature detection part configured to detect a temperature inside a casing of the proximity sensor; a storage part configured to store a characteristic parameter unique to the proximity sensor in advance; and a control calculation part configured to process a digital signal from the analog/digital conversion circuit to calculate a signal indicating a distance to the detection object, compensate the calculated signal using the characteristics parameter stored in the storage part, and then output the compensated signal as the detection result.

DESCRIPTION OF THE EMBODIMENTS

Embodiments of the disclosure will be described in detail with reference to the drawings. The same reference numerals are given to the same or equivalent portions in the drawings and the description thereof will not be repeated.

<A. Configuration of Proximity Sensor>

First, a configuration of a proximity sensor 1 according to an embodiment will be described. The proximity sensor 1 according to the embodiment outputs presence or absence or a position of a detection object W as a detection result. A conductive object such as a metal is assumed as the detection object W.

Figure 1:
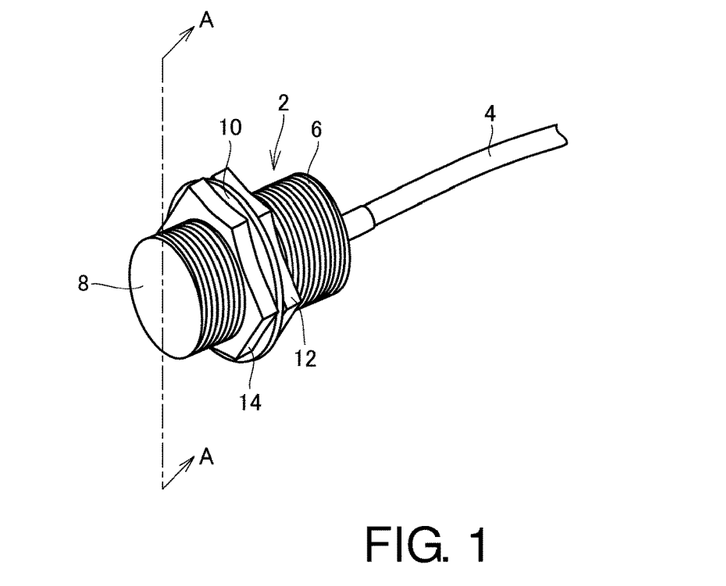
FIG. 1 is a perspective view illustrating a proximity sensor according to an embodiment.
Figure 2:
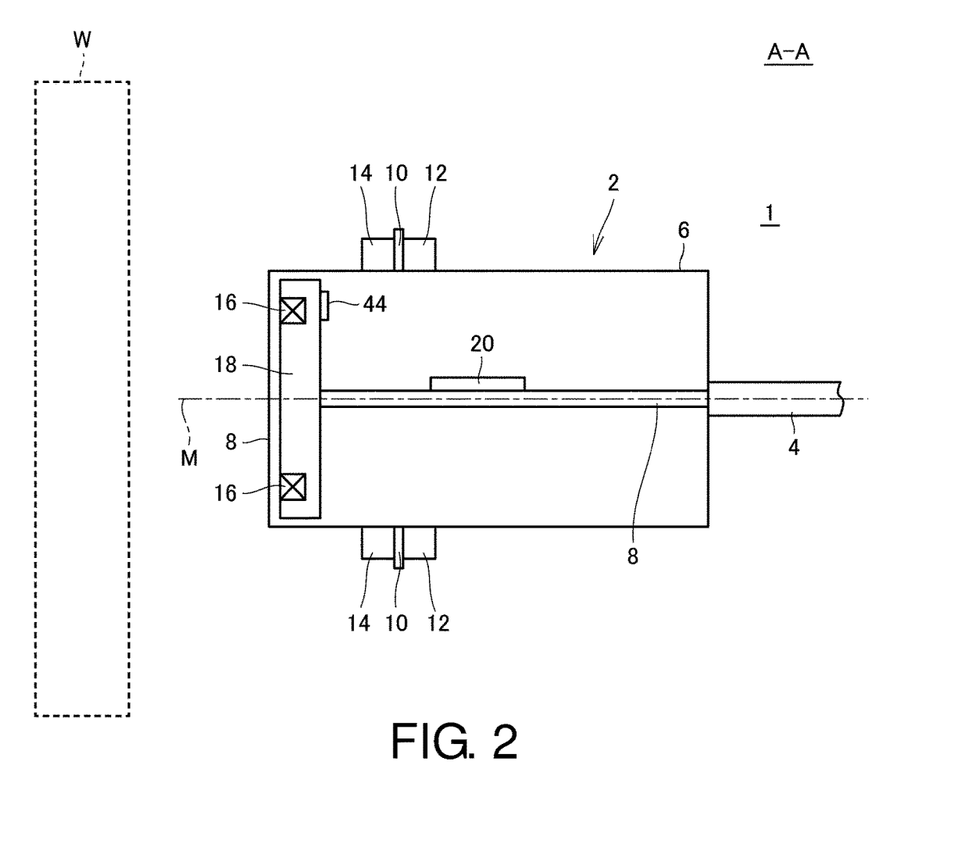
FIG. 2 is a sectional view illustrating the proximity sensor taken along the arrow line A-A illustrated in FIG. 1.

FIG. 1 is a perspective view illustrating the proximity sensor 1 according to the embodiment. FIG. 2 is a sectional view illustrating the proximity sensor 1 taken along the arrow line A-A illustrated in FIG. 1.

Referring to FIG. 1, the proximity sensor 1 includes a body 2 and a lead wire 4 connected to the body 2. Nuts 12 and 14 and a washer 10 disposed between the nuts 12 and 14 may be further mounted on the proximity sensor 1.

The body 2 includes a cylindrical casing 6 and a circular detection surface 8 disposed at one end of the casing 6. The detection surface 8 may be formed as a part of a cap fitted onto the casing 6. Screw grooves for the nuts 12 and 14 are formed on the surface of the casing 6. Further, an operation indication lamp or the like (not illustrated) may be disposed in the body 2.

The nuts 12 and 14 and the washer 10 are used to mount the body 2 on a holding member of a device or the like. For example, the body 2 can be fixed to the support member by interposing a part of fitting (for example, an L-shaped fitting) between the nuts 12 and 14.

Referring to FIG. 2, a detection coil 16, a ferrite core 18, and a processing circuit 20 in which an element is disposed on a substrate are included inside the casing 6 of the body 2. The inside of the casing 6 is filled with a resin and is sealed from the outside.

An annular or a substantially annular coil is used as the detection coil 16. A substantial center of the detection coil 16 is located on a central axis M of the casing 6. The detection coil 16 is electrically connected to the processing circuit 20. The processing circuit 20 receives power via the lead wire 4 and outputs a detection result or the like to the outside.

An external temperature sensor 44 may be disposed near the detection coil 16. A temperature detected by the external temperature sensor 44 is output to the processing circuit 20.

FIG. 1 illustrates a configuration in which the lead wire 4 is directly connected to the body 2, but both the lead wire 4 and the body 2 may be connected as a detachable connector. As the configuration in which the body 2 is disposed at a predetermined position, not only the configuration in which the nuts 12 and 14 and the washer 10 illustrated in FIG. 1 are used but also any support member can be used. The proximity sensor 1 according to the embodiment mainly has the body 2 with a different configuration from the technology of the related art and any structure attached to the support member can be adopted.

<B. Configuration of Processing Circuit>

Figure 3:
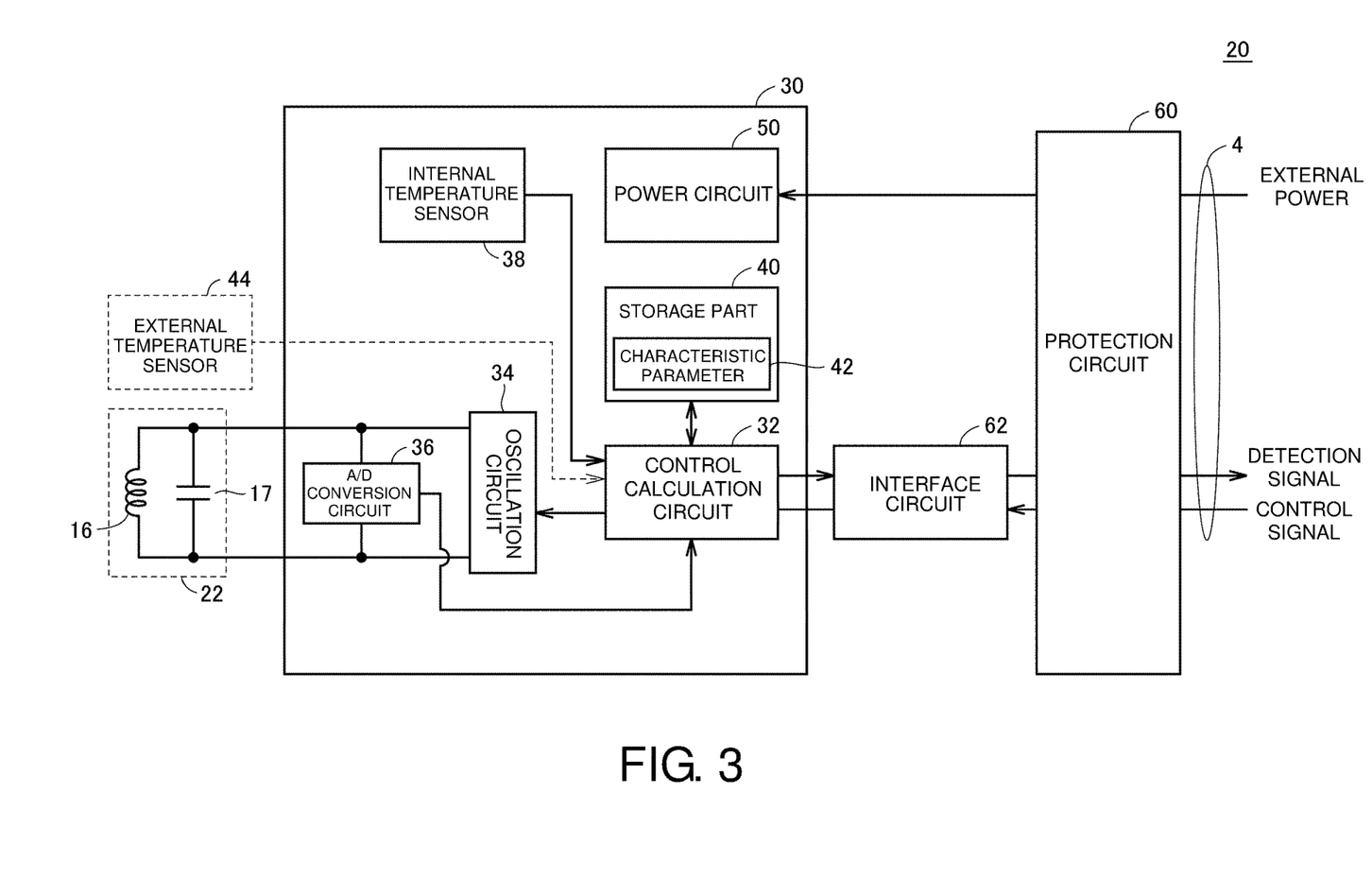
FIG. 3 is a block diagram illustrating an example of a configuration of a processing circuit included in the proximity sensor according to the embodiment.

Next, an example of a configuration of the processing circuit 20 included in the proximity sensor 1 will be described. FIG. 3 is a block diagram illustrating an example of a configuration of the processing circuit 20 included in the proximity sensor 1 according to the embodiment.

Referring to FIG. 3, the processing circuit 20 includes a main circuit 30, an interface circuit 62, and a protection circuit 60. The main circuit 30 is connected to a detection part 22 including the detection coil 16 and a capacitor 17.

The main circuit 30 oscillates the detection coil 16 and monitors an oscillation state of the detection coil 16. More specifically, the main circuit 30 includes a control calculation circuit 32, an oscillation circuit 34, an analog/digital conversion circuit (hereinafter also referred to as an "analog-to-digital (A/D) conversion circuit") 36, an internal temperature sensor 38, a storage part 40, and a power circuit 50.

The control calculation circuit 32 is a circuit that executes a main process in the processing circuit 20. More specifically, the control calculation circuit 32 outputs an oscillation control signal to the oscillation circuit 34, receives an input of a detection signal (digital signal) from the A/D conversion circuit 36, and executes a process of detecting presence or absence of the detection object W and/or a process of detecting a distance to the detection object W. At this time, the control calculation circuit 32 compensates temperature dependency of electric characteristics of the detection part 22 with reference to the temperature detected by the internal temperature sensor 38 and/or the external temperature sensor 44 and a characteristic parameter 42 stored in the storage part 40.

In the embodiment, each unique value of the proximity sensor 1 is stored as the characteristic parameter 42. That is, the characteristic parameter 42 unique to the proximity sensor 1 is stored in advance in the storage part 40. A determination process for the characteristic parameter 42 and a compensation process using the characteristic parameter 42 will be described later.

In this way, the control calculation circuit 32 calculates a signal indicating a distance to the detection object W by processing a digital signal from the A/D conversion circuit 36, compensates the calculated signal using the characteristic parameter 42 stored in the storage part 40, and then outputs the compensated signal as a detection result.

The oscillation circuit 34 generates an excitation current with a high frequency in accordance with an oscillation control signal from the control calculation circuit 32 and excites the detection part 22. The frequency of the excitation current from the oscillation circuit 34 is determined in consideration of a resonant frequency or the like of the detection part 22.

The detection part 22 includes the detection coil 16 and the capacitor 17 connected in parallel to the detection coil 16. The detection part 22 configures an LC parallel resonant circuit (LC tank circuit) in accordance with an L component of the detection coil 16 and a C component of the capacitor 17. When the oscillation circuit 34 excites and there is no detection object W, the LC parallel resonant circuit of the detection part 22 enters a resonant state. In FIG. 3, to facilitate description, a parallel circuit of the detection coil 16 and the capacitor 17 is illustrated. However, the disclosure is not limited thereto. Any circuit may be adopted as long as a resonant circuit including the detection coil 16 is used.

The A/D conversion circuit 36 executes A/D conversion on a voltage (analog signal) generated at both ends of the detection part 22 and outputs a digital signal. The digital signal output from the A/D conversion circuit 36 is provided to the control calculation circuit 32. That is, the A/D conversion circuit 36 detects a signal change occurring in the detection part 22 and outputs a digital signal indicating the detected signal change.

The storage part 40 is a rewritable nonvolatile storage device. For example, an electrically erasable programmable read-only memory (EEPROM) can be used. The storage part 40 stores a program and data necessary for the control calculation circuit 32 to execute a process in addition to the characteristic parameter 42.

In the proximity sensor 1, a temperature detection part that detects a temperature inside the casing 6 of the proximity sensor 1 is installed.

More specifically, the internal temperature sensor 38 which is an example of the temperature detection part is disposed on the same substrate as the control calculation circuit 32 (a first temperature sensor). By mounting the internal temperature sensor 38 as a part of the main circuit 30 along with the control calculation circuit 32, it is possible to reduce cost related to the disposition of the temperature detection part.

The external temperature sensor 44 which is another example of the temperature detection part is disposed at a position closer to the detection part 22 than the internal temperature sensor 38. That is, the external temperature sensor 44 is disposed inside the casing 6 of the proximity sensor 1 and at a different position from the processing circuit 20. The external temperature sensor 44 may be disposed at a position away from a heat source such as the power circuit 50 and near the detection part 22. The external temperature sensor 44 may be disposed to measure the temperature of the detection part 22 with higher precision while reducing an influence of heat generated from the power circuit 50 or the like included in the processing circuit 20.

As the internal temperature sensor 38 and/or the external temperature sensor 44, for example, a thermistor, a resistance thermometer formed of platinum or the like, or a thermocouple can be used.

It is not necessary to mount both the internal temperature sensor 38 and the external temperature sensor 44, and only one of the temperature sensors may be mounted.

Hereinafter, a temperature detected by the temperature detection part (the internal temperature sensor 38 and/or the external temperature sensor 44) is collectively referred to as an "internal casing temperature."

The power circuit 50 receives power from an external power source and generates power to drive the main circuit 30 and peripheral circuits. As the power circuit 50, for example, a circuit including a switching regulator is adopted.

The interface circuit 62 is a circuit that relays exchange of data between the main circuit 30 and an external device and, for example, outputs a detection result calculated in the control calculation circuit 32 to an external device and provides a control signal from an external device to the control calculation circuit 32.

The interface circuit 62 outputs a signal indicating a temperature detected by the temperature detection parts (the internal temperature sensor 38 and the external temperature sensor 44) to the outside. Further, the interface circuit 62 receives the characteristic parameter 42 written on the storage part 40. That is, the characteristic parameter received by the interface circuit 62 is written on the storage part 40. The signal indicating the temperature and the exchange of the characteristic parameter 42 will be described later.

The protection circuit 60 suppresses serge, noise, or the like which can invade a signal transmitted via each signal line included in the lead wire 4.

A display device or the like (not illustrated) may be connected to the proximity sensor 1. In this case, a control signal may be provided from the processing circuit 20 to the display device.

For example, the main circuit 30 may be packaged using an application specific integrated circuit (ASIC) or the like. A mounting form for the processing circuit 20 is not particularly limited, but any mounting form can be adopted.

<C. Operation Principle>

Next, an operation principle of the proximity sensor 1 according to the embodiment will be described.

In an operation state, the detection coil 16 is excited by the oscillation circuit of the processing circuit 20 of the proximity sensor 1. When an excitation current with a high frequency is supplied to the detection coil 16 by the excitation of the oscillation circuit, a high-frequency magnetic field is generated from the detection coil 16. On the other hand, when the detection object W which is a metal object approaches the high-frequency magnetic field generated by the detection coil 16, an induced current flows in the detection object W by an electromagnetic induction phenomenon and a heat loss (resistance loss) occurs in the detection object W.

An increase in the heat loss occurring in the detection object W increases results in an increase in an influence of the oscillation circuit on an oscillation state of the detection coil 16, and thus an oscillation amplitude may be attenuated or the oscillation may not be maintained. Based on a change in the oscillation state, presence or absence of the detection object W or a distance to the detection object W can be detected.

Figure 4A:
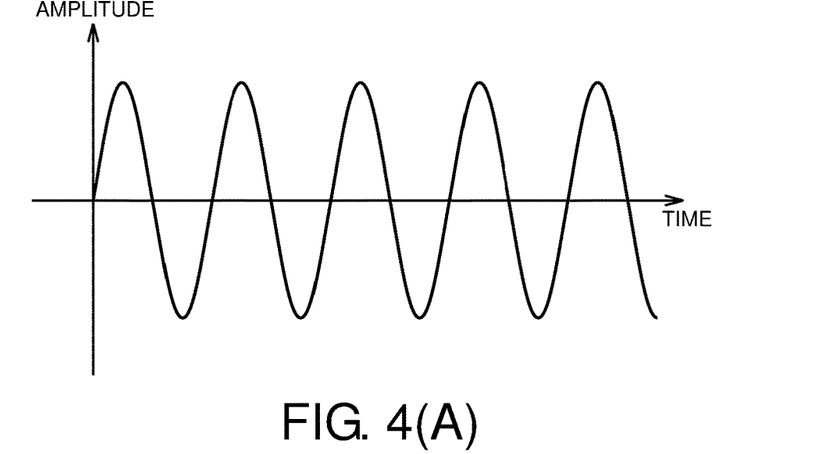
FIGS. 4(A), 4(B) and 4(C) are diagrams for describing an operation principle of the proximity sensor according to the embodiment.
Figure 4B:
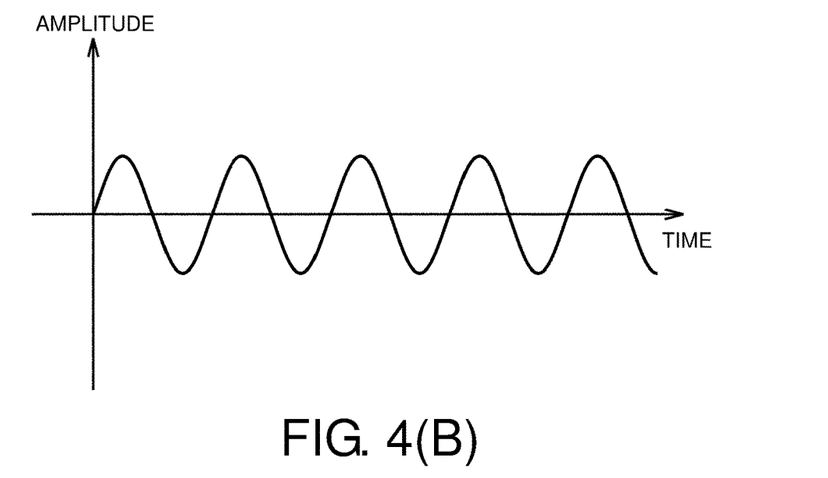
Figure 4C:
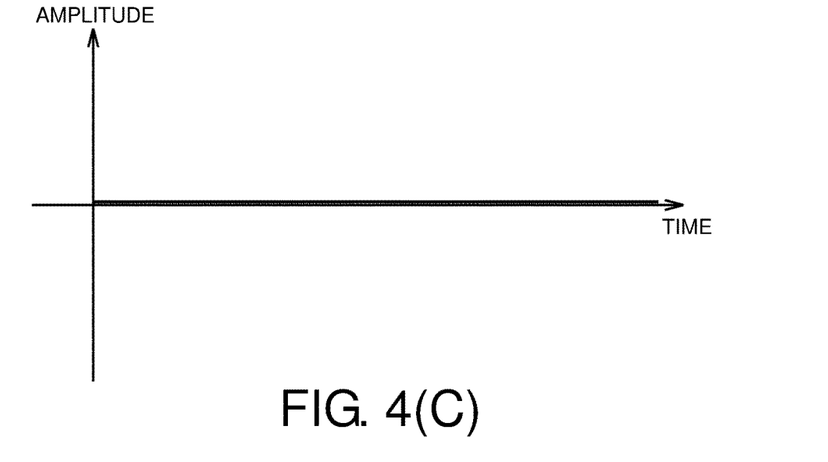

FIGS. 4(A), 4(B) and 4(C) are diagrams for describing an operation principle of the proximity sensor 1 according to the embodiment. FIG. 4(A) illustrates an example of a time waveform of a detected signal detected by the A/D conversion circuit 36 of the main circuit 30 when there is no detection object W within a detectable range of the proximity sensor 1. As illustrated in FIG. 4(A), when there is no detection object W within a detectable range of the proximity sensor 1, the detection part 22 is in an oscillation state.

FIGS. 4(B) and 4(C) illustrate examples of time waveforms of the detection signal detected by the A/D conversion circuit 36 of the main circuit 30 when there is the detection object W within a detectable range of the proximity sensor 1. It can be understood that an oscillation state of the time waveform illustrated in FIG. 4(B) is maintained and the amplitude of the time waveform becomes smaller than the oscillation waveform illustrated in FIG. 4(A). The time waveform illustrated in FIG. 4(C) corresponds to a state in which the detection object W is closer to the proximity sensor 1. The time waveform illustrated in FIG. 4(C) indicates that the oscillation state is not maintained.

As illustrated in FIG. 4(A) to FIG. 4(C), the oscillation state of the detection part 22 is changed when the detection object W approaches the proximity sensor 1. That is, the presence or absence of the detection object W or the distance to the detection object W can be detected based on the change in the oscillation state of the detection part 22.

<D. Detection Process and Temperature Compensation>

Next, a detection process and temperature compensation in the proximity sensor 1 according to the embodiment will be described.

Figure 5:
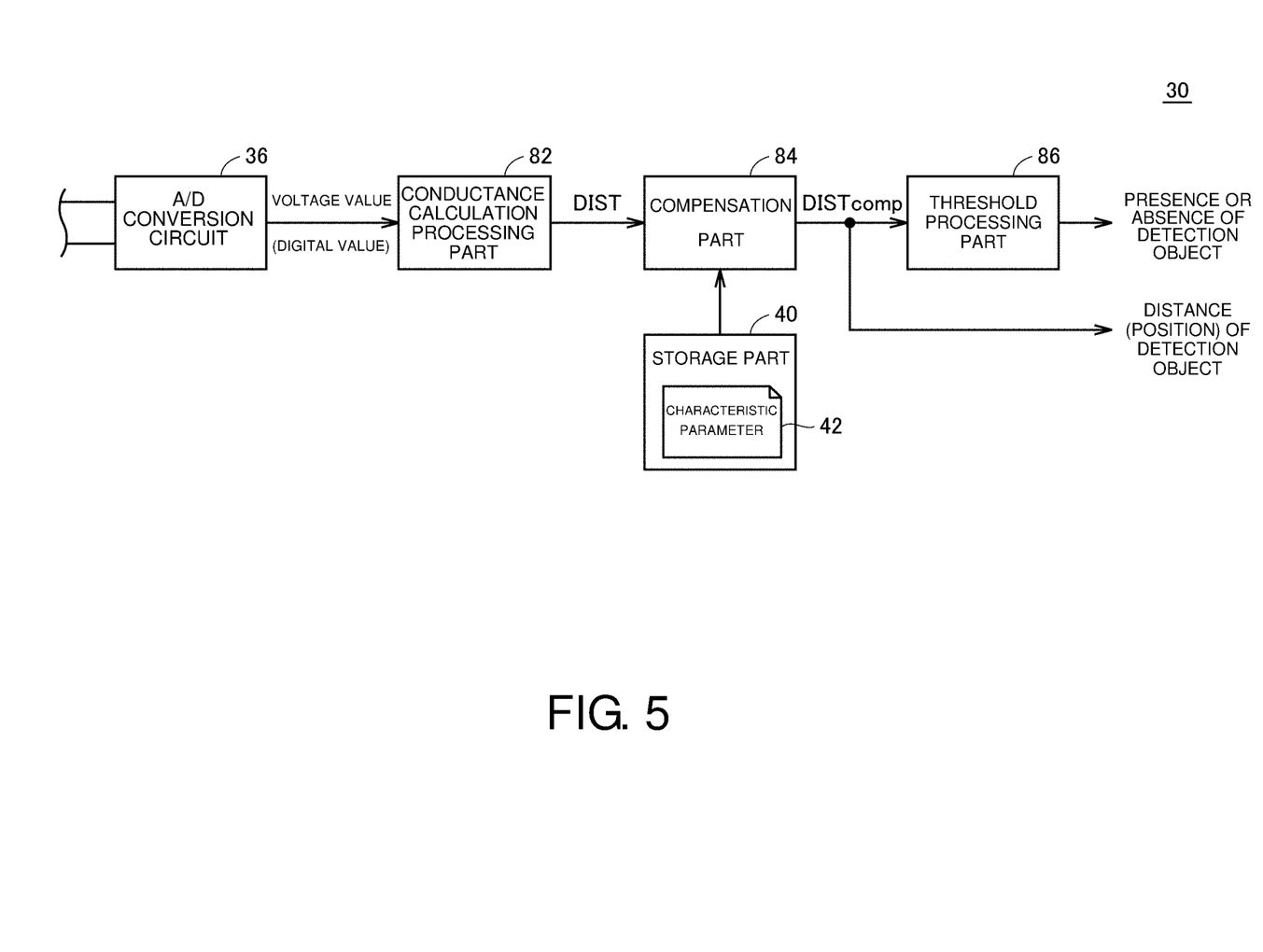
FIG. 5 is a schematic view illustrating a functional configuration of a main circuit of the proximity sensor according to the embodiment.

FIG. 5 is a schematic view illustrating a functional configuration of the main circuit 30 of the proximity sensor 1 according to the embodiment. Referring to FIG. 5, the A/D conversion circuit 36 outputs a voltage value occurring at both ends of the detection part 22 (including the detection coil 16 and the capacitor 17: see FIG. 3) as a digital value.

The main circuit 30 is a module capable of executing an arithmetic operation and includes a conductance calculation processing part 82, a compensation part 84, and a threshold processing part 86.

The conductance calculation processing part 82 calculates the magnitude of conductance of the detection coil 16 based on a time change in the voltage value output from the A/D conversion circuit 36. That is, the conductance calculation processing part 82 calculates a value equivalent to the magnitude of the conductance of the detection coil 16 based on a voltage waveform occurring at both ends of the detection coil 16. The magnitude of the conductance indicates ease with which a current flows in the detection coil 16. When the detection object W approaches the detection part 22 and an induced current flowing in the detection part 22 relatively increases, the current hardly flows in the detection coil 16. As a result, the conductance of the detection coil 16 decreases. That is, the magnitude of the conductance indicates how difficult it is for current to flow in the detection coil 16.

As a method of calculating the conductance, for example, a ratio of the amplitude occurring at both ends of the detection part 22 to a reference amplitude is used to calculate the conductance. Alternatively, the conductance can also be calculated based on a time change (amplitude and phase) of the voltage occurring at both ends of the detection part 22.

A calculation result of the conductance output from the conductance calculation processing part 82 is referred to as "DIST" meaning a distance below. The magnitude of the distance output DIST is proportional to the calculation result of the conductance. That is, the distance output DIST indicates the magnitude of the distance between the detection part 22 and the detection object W.

The compensation part 84 compensates a change in the detection characteristics which depend on a temperature occurring in the detection part 22. More specifically, the compensation part 84 compensates the distance output DIST based on the characteristics parameter 42 stored in the storage part 40. The compensation distance output from the compensation part 84 is also referred to as "DISTcomp."

For example, when k is a linear coefficient and α and β are constants predetermined for the characteristic parameter 42, the compensation distance output DISTcomp can be calculated by Expression (1) below.

$$\text{DISTcomp} = k(\text{DIST} + \alpha) + \beta \tag{1}$$

The temperature compensation process is not limited to the above-described expression and any expression can be adopted. The characteristic parameter 42 is not limited to the one-dimensional constants and multi-dimensional constants may be adopted. Further, a compensation amount can also be calculated by reflecting the temperature detected by the internal temperature sensor 38.

In the proximity sensor 1 according to the embodiment, the storage part 40 stores each unique value of the proximity sensor 1 as the characteristics parameter 42. By adopting the characteristic parameter 42 unique to each proximity sensor 1, compensation appropriate for each proximity sensor 1 can be realized even when there is variation in the detection characteristic change between the detection parts 22.

The compensation distance output DISTcomp may be output as a detection result indicating a distance (a position) to the detection object W, or input to the threshold processing part 86 and subjected to a binarization process and the result may be output as a detection result indicating presence or absence of the detection object W.

The threshold processing part 86 compares the compensation distance output DISTcomp from the compensation part 84 with a predetermined threshold. When the compensation distance output DISTcomp is less than the threshold, a detection result indicating there is the detection object W is output.

Figure 6A:
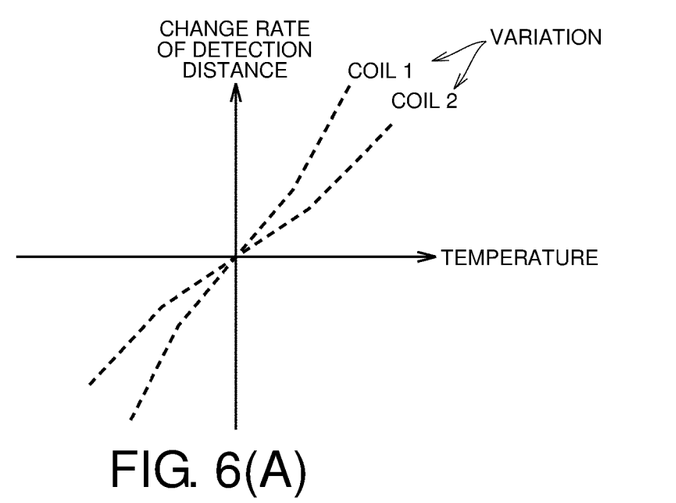
FIGS. 6(A) and 6(B) are diagrams for describing a temperature change of detection characteristics occurring in a change in detection characteristics and compensation for the temperature change.
Figure 6B:
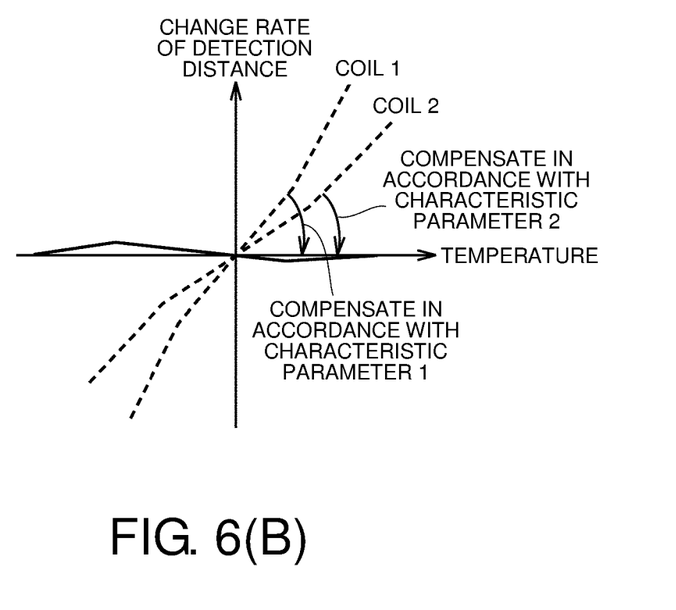

FIGS. 6(A) and 6(B) are diagrams for describing a temperature change of detection characteristics occurring in a change in detection characteristics and compensation for the temperature change. FIGS. 6(A) and 6(B) illustrate an example of a change rate of a detection distance to a temperature. It is ideal that the change rate of the detection distance is zero regardless of the temperature.

For example, FIG. 6(A) illustrates an example of a temperature change of the detection characteristics occurring in the detection coil 16 (coil 1) of a certain proximity sensor 1 and a temperature change of the detection characteristics occurring in the detection coil 16 (coil 2) of another proximity sensor 1. As illustrated in FIG. 6(A), electromagnetic characteristics are not completely uniform even when manufacturing conditions or the like are set to be the same. For this reason, the detection characteristics after the compensation may not be uniform even when the same compensation parameter is used. Therefore, the variation in the detection characteristics is a major factor hindering in an improvement in detection precision or expansion of the detectable range. That is, it is necessary to execute the detection process on the assumption that there is a variation in the detection characteristics, and thus the precision inevitably deteriorates.

In the proximity sensor 1 according to the embodiment, however, the characteristic parameter 42 unique to each proximity sensor 1 is used for compensation. By using the characteristic parameter 42 unique to each proximity sensor 1, as illustrated in FIG. 6(B), for example, the compensation is executed on the coil 1 in accordance with a characteristic parameter 1 unique to the coil 1 and the compensation is executed on the coil 2 in accordance with a characteristic parameter 2 unique to the coil 2.

As illustrated in FIG. 6(B), by adopting the characteristic parameter 2 unique to each proximity sensor 1, the detection characteristics after the compensation become substantially the same. As a result, the detection characteristics after the temperature compensation can be uniform. Therefore, by reducing margin due to the variation in the detection characteristics, it is possible to further improve detection precision and detection sensitivity. As a result, it is possible to realize an improvement in the detection precision or expansion of the detectable range.

<E. Determining Characteristic Parameter (Manufacturing Method)>

Next, a system configuration and a processing procedure for determining the characteristic parameter 42 stored in the proximity sensor 1 according to the embodiment will be described. Such a process may be executed as a part of a manufacturing process for the proximity sensor 1.

In the embodiment, an ambient temperature of the proximity sensor 1 is actually changed, the distance output DIST of the proximity sensor 1 occurring due to a change in the ambient temperature is measured, and a value of the characteristic parameter 42 is determined based on the measured value. Basically, the proximity sensor 1 is an industrial product. Many products of the same type are manufactured. Therefore, measuring the proximity sensors 1 one by one is impractical. The value of the characteristic parameter 42 of the individual proximity sensor 1 is determined by simultaneously measuring the plurality of proximity sensors 1.

(e1: Characteristic Parameter Determination System)

Figure 7:
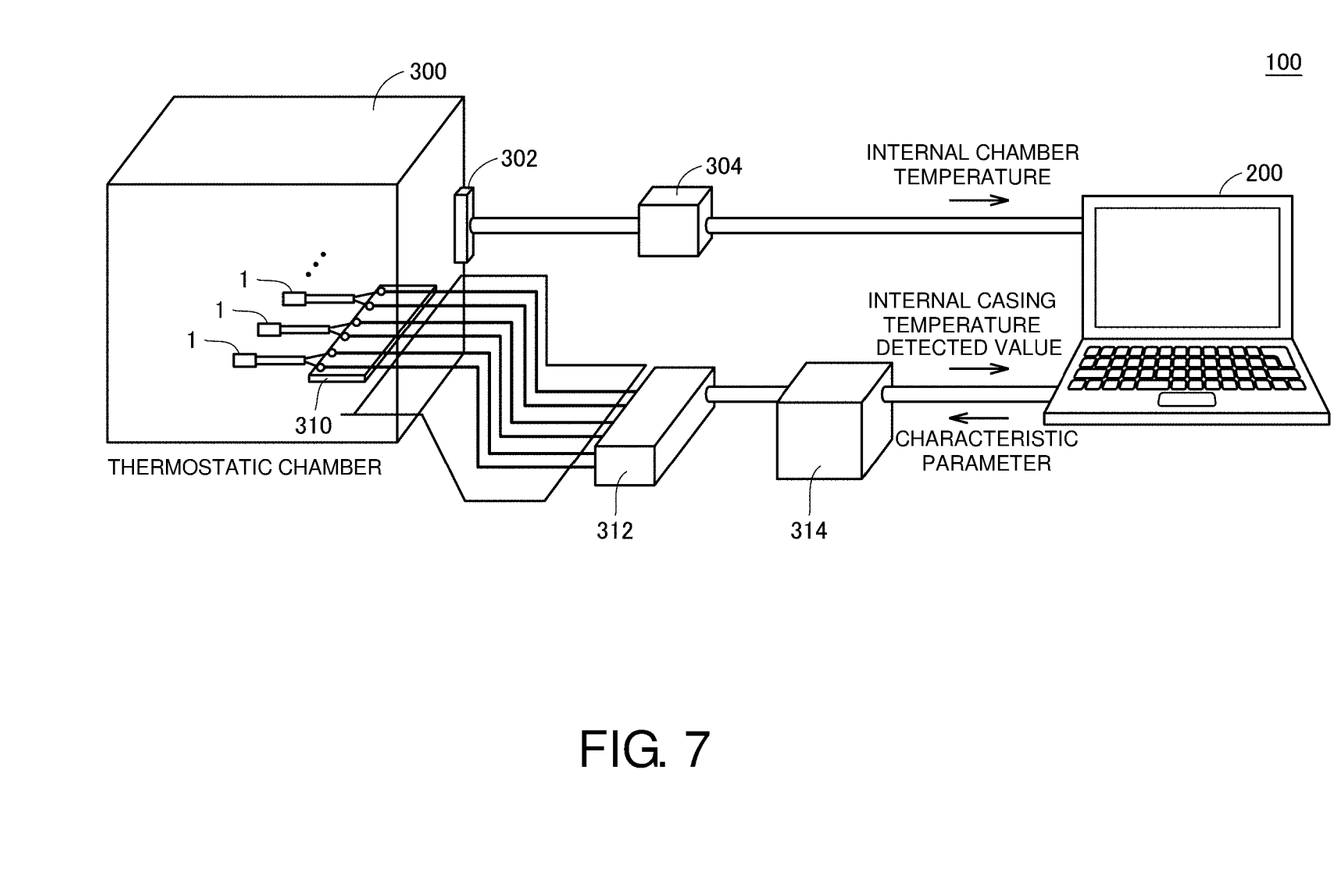
FIG. 7 is a schematic view for describing a method of determining characteristic parameter of the proximity sensor according to the embodiment.

FIG. 7 is a schematic view for describing a method of determining the characteristic parameter of the proximity sensor 1 according to the embodiment. Referring to FIG. 7, a manufacturing system 100 of the proximity sensor 1 determines the characteristic parameter of one proximity sensor 1 or the plurality of proximity sensors 1.

Specifically, the manufacturing system 100 includes a setting device 200, a thermostatic chamber 300, an internal chamber temperature sensor 302, a signal conversion device 304, a terminal board 310, a line concentrator 312, and a control device 314.

The setting device 200 calculates the characteristic parameter of each proximity sensor 1 based on measurement results (an internal casing temperature and a detected value) from one proximity sensor 1 or the plurality of proximity sensors 1 and an internal chamber temperature and sets the calculated characteristic parameter for each proximity sensor 1.

Figure 8:
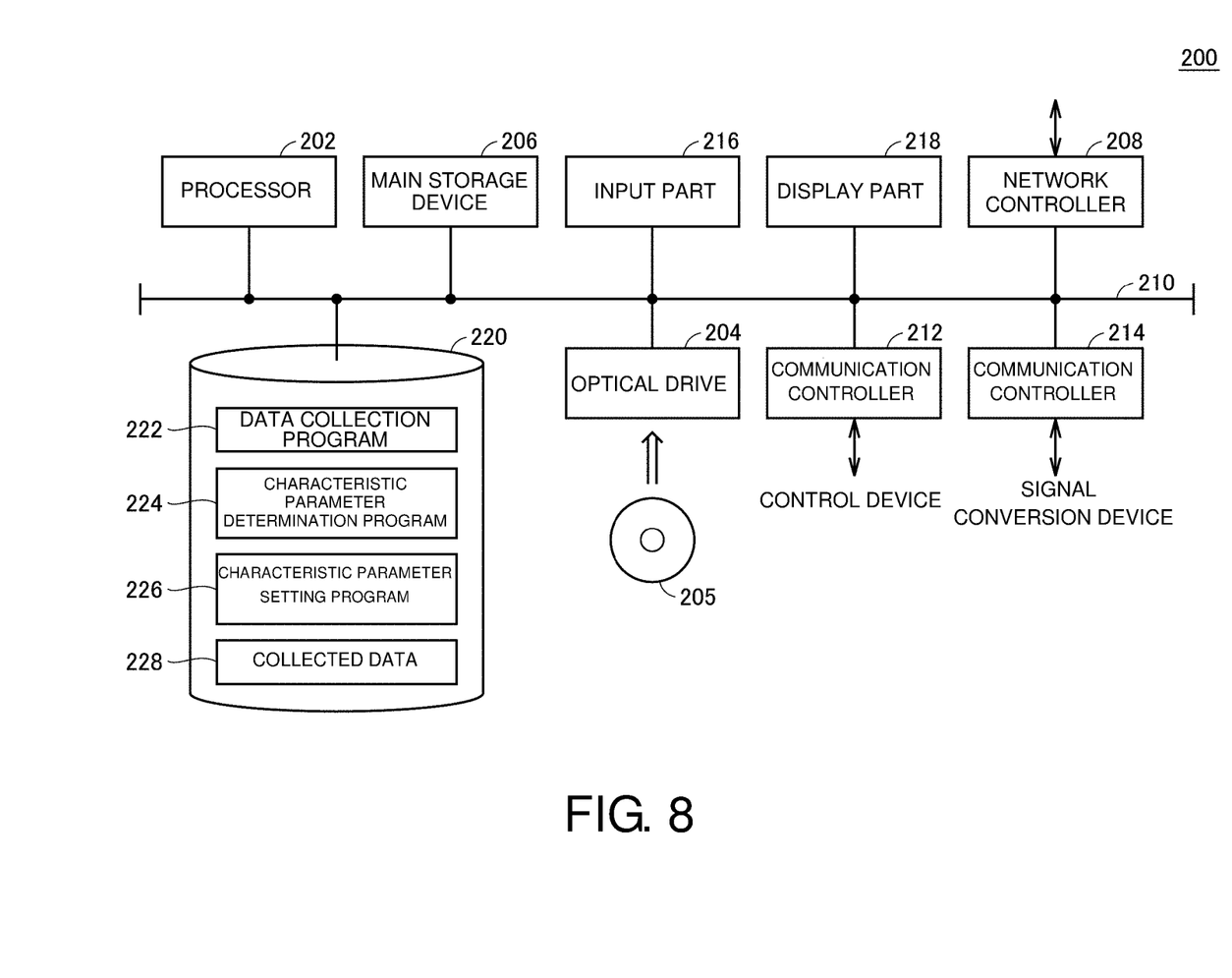
FIG. 8 is a schematic view illustrating an example of a hardware configuration of a setting device illustrated in FIG. 7.

FIG. 8 is a schematic view illustrating an example of a hardware configuration of the setting device 200 illustrated in FIG. 7. The setting device 200 according to the embodiment is realized by executing a program using, for example, hardware (for example, a general PC) designed in accordance with a general architecture.

Referring to FIG. 8, the setting device 200 includes a processor 202 such as a CPU or an MPU, an optical drive 204, a main storage device 206, a network controller 208, communication controllers 212 and 214, an input part 216, a display part 218, and a secondary storage device 220. These components are connected to each other via a bus 210.

The processor 202 realizes various processes to be described later by reading various programs stored in the secondary storage device 220 and loading and executing the programs in the main storage device 206.

The secondary storage device 220 includes, for example, a hard disk drive (HDD) or a solid state drive (SSD). The secondary storage device 220 includes a data collection program 222 that collects data from one proximity sensor 1 or the plurality of proximity sensors 1, a characteristic parameter determination program 224 that determines the characteristic parameter of the proximity sensor 1 based on the collected data, and a characteristic parameter setting program 226 that sets the determined characteristic parameter in the proximity sensor 1. The secondary storage device 220 may further store an OS and other necessary programs. Further, the secondary storage device 220 stores collected data 228 when the characteristic parameter 42 is determined.

The setting device 200 includes the optical drive 204. A program stored in a recording medium 205 (for example, an optical recording medium such as a digital versatile disc (DVD)) that stores computer-readable programs in a non-transitory manner is read and installed in the secondary storage device 220 or the like.

Various programs to be executed by the setting device 200 may be installed via the computer-readable recording medium 205 or may be downloaded from a server device on a network to be installed. A function provided by the setting device 200 according to the embodiment is realized using a part of a module provided by the OS.

The input part 216 includes a keyboard or a mouse and receives a user operation. The display part 218 includes a display, various indicators, or a printer and outputs a processing result or the like from the processor 202.

The network controller 208 controls exchange data with another device via any network.

The communication controller 212 exchanges data with one proximity sensor 1 or the plurality of proximity sensors 1 via the control device 314 and the line concentrator 312 (see FIG. 7). The communication controller 214 acquires an internal chamber temperature measured by the internal chamber temperature sensor 302 via the signal conversion device 304.

FIG. 8 illustrates an example of a configuration in which necessary functions are provided when the processor 202 executes a program, but some or all of the provided functions may be mounted using a dedicated hardware circuit (for example, ASIC or FPGA).

Referring back to FIG. 7, the thermostatic chamber 300 can accommodate one proximity sensor 1 or the plurality of proximity sensors 1 in the chamber and change an internal chamber temperature. That is, the thermostatic chamber 300 is an example of a device that provides a temperature-changeable environment. The internal chamber temperature of the thermostatic chamber 300 may be changed in accordance with a preset pattern or may be changed by an instruction from the setting device 200.

One internal chamber temperature sensor 302 or the plurality of internal chamber temperature sensors 302 are disposed inside the thermostatic chamber 300 and detect an internal chamber temperature. A detection result by the internal chamber temperature sensor 302 is output to the signal conversion device 304. The signal conversion device 304 converts the detection result from the internal chamber temperature sensor 302 into a predetermined data format to transmit the detection result to the setting device 200. When the internal chamber temperature sensor 302 has a communication function, the signal conversion device 304 may be omitted.

One proximity sensor 1 or the plurality of proximity sensors 1 inside the thermostatic chamber 300 are supported by a rack or a fixing member (not illustrated). To uniformly change the ambient temperature, the proximity sensors 1 may be disposed uniformly at predetermined intervals.

Signal lines extending from one proximity sensor 1 or the plurality of proximity sensors 1 are connected to the terminal board 310. The line concentrator 312 is also connected to the terminal board 310. The proximity sensor 1 is electrically connected to the line concentrator 312. The line concentrator 312 is a device that concentrates the exchange of signals of the plurality of proximity sensors 1 and includes a communication module and a multiplexer.

The control device 314 is disposed between the line concentrator 312 and the setting device 200, outputs signals collected via the line concentrator 312 to the setting device 200 in response to a request from the setting device 200, and provides a setting value or the like from the setting device 200 to the proximity sensor 1 via the line concentrator 312.

When the line concentrator 312 can directly communicate with the setting device 200, it is not necessary to dispose the control device 314.

In the manufacturing system 100 illustrated in FIG. 7, for example, a general industrial controller is used. For example, a programmable controller (PLC) may be adopted as the control device 314. In this case, the line concentrator 312 may be connected via a field network connected to the PLC. Further, the line concentrator 312 and the proximity sensor 1 may be connected to each other via a field network.

As such a field network, IO-Link, CC-Link, DeviceNet, EtherCat (registered trademark), EtherNet/IP, or the like can be used.

The proximity sensor 1 and the line concentrator 312 may be connected via a signal line through which an analog signal flows. However, by using a field network, it is possible to more easily execute duplex communication.

(e2: Determination and Setting Procedure for Characteristic Parameter)

Next, a procedure of a process of determining and setting the characteristic parameter 42 stored in the proximity sensor 1 according to the embodiment will be described.

Figure 9:
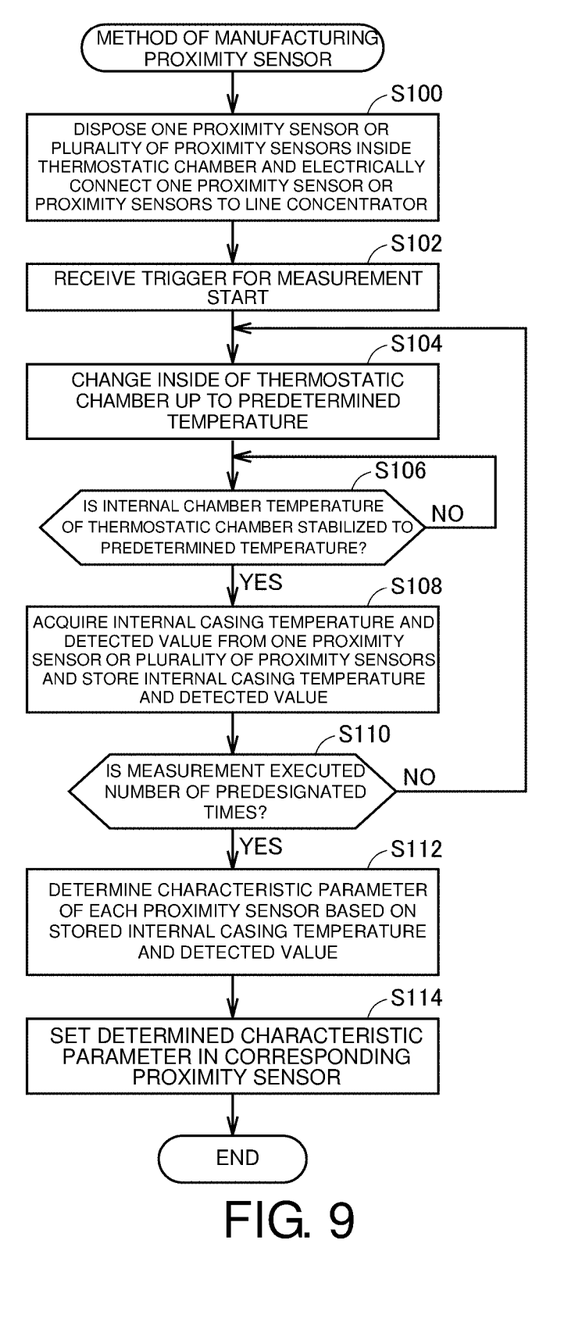
FIG. 9 is a flowchart illustrating a processing procedure for a manufacturing method including determination and setting of the characteristic parameter of the proximity sensor according to the embodiment.

FIG. 9 is a flowchart illustrating a processing procedure for a manufacturing method including determination and setting of the characteristic parameter of the proximity sensor 1 according to the embodiment. Some of the steps illustrated in FIG. 9 are realized when the processor 202 of the setting device 200 executes a program.

Referring to FIG. 9, one proximity sensor 1 or the plurality of proximity sensors 1 are disposed inside the thermostatic chamber 300 and are electrically connected to the line concentrator 312 via the terminal board 310 (step S100). That is, the proximity sensor 1 is disposed in a temperature-changeable environment.

A trigger for measurement start is received (step S102) and the inside of the thermostatic chamber 300 is changed to a predetermined temperature (step S104).

When the internal chamber temperature of the thermostatic chamber 300 is stabilized to the predetermined temperature (Yes in step S106), the setting device 200 acquires the internal casing temperature and the detected value from one proximity sensor 1 or each of the plurality of proximity sensors 1 disposed inside the thermostatic chamber 300 and stores the internal casing temperature and the detected value (step S108).

It is determined whether the measurement is executed the number of predesignated times (step S110). When the measurement is not executed the number of predesignated times (No in step S110), the processes of step S104 and subsequent processes are repeated.

In this way, the environment of the proximity sensor 1 is set to a plurality of different temperatures. The internal casing temperature detected by the temperature detection part (the internal temperature sensor 38 and/or the external temperature sensor 44) of the proximity sensor 1 and the detection result output by the control calculation circuit 32 at each temperature are stored in association with each other.

Conversely, when the measurement is executed the number of predesignated times (Yes in step S110), the setting device 200 determines the characteristic parameter 42 for one proximity sensor 1 or each of the plurality of proximity sensors 1 based on the stored internal casing temperature and detected value (step S112). That is, the characteristic parameter 42 unique to the target proximity sensor 1 is determined based on the stored temperature and detection result.

Finally, the determined characteristic parameter 42 is set for the corresponding proximity sensor 1 (step S114). That is, a process of setting the determined characteristic parameter 42 in the proximity sensor 1 is executed.

With the above-described processing procedure, the determination of the characteristic parameter 42 and the setting of the characteristic parameter 42 in the proximity sensor 1 are completed.

The number of combinations of the internal casing temperatures and the detected values acquired from the proximity sensors 1 is determined in accordance with an order of an approximation expression of the characteristic parameter to be described below.

(e3: Process of Determining Characteristic Parameter)

Next, a process of determining the characteristic parameter 42 stored in the proximity sensor 1 according to the embodiment will be described.

The characteristic parameter 42 is a parameter for reducing the temperature dependency of the detection characteristics indicated by the individual proximity sensor 1. As illustrated in FIG. 6(B) described above, the characteristic parameter 42 is determined so that a change rate of a detected distance is constant regardless of temperature.

More specifically, variables $A_2$, $A_1$, and $A_0$ are fitted so that Expression (2) below is established using an internal layer temperature $T_n$, a reference temperature $T_0$, and a temperature difference $\Delta T$ between the ambient temperature and the internal casing temperature detected by the internal temperature sensor 38.

$$f(T_n) = A_2(T_n - T_0 + \Delta T)^2 + A_1(T_n - T_0 + \Delta T) + A_0 = k (\text{constant})$$

That is, by fitting Expression (2) described above using the plurality of combinations of the internal casing temperatures and the detected values (for example, the distance output DIST or a change amount of the distance output DIST) acquired from the target proximity sensor 1, the variables $A_2$, $A_1$, and $A_0$ can be determined. The coefficient k calculated using the determined variables $A_2$, $A_1$, and $A_0$ can be determined as the characteristic parameter 42.

The internal chamber temperature detected by the internal chamber temperature sensor 302 can be used as the ambient temperature used for the temperature difference $\Delta T$. When the plurality of internal chamber temperature sensors 302 are disposed, the ambient temperature at a position of interest may be estimated based on temperature detected by each of the plurality of internal chamber temperature sensors 302 around the position of interest and a distance between the position of interest and each of the internal chamber temperature sensors 302.

The Expression (2) described above is merely an example and the temperature dependency of the detection characteristics of the detection part 22 (the detection coil 16) may be approximated with any function. As a variable value of the approximate function, one of the internal casing temperature detected by the internal temperature sensor 38 and/or the external temperature sensor 44 of the proximity sensor 1 and the internal chamber temperature detected by the internal chamber temperature sensor 302 may be involved. Here, when the internal chamber temperature detected by the internal chamber temperature sensor 302 or the internal casing temperature detected by the external temperature sensor 44 is provided as information rather than only the internal casing temperature detected by the internal temperature sensor 38 of the proximity sensor 1, precision can be further improved.

(e4: Collected Data)

Next, an example of the collected data 228 collected to determine the characteristic parameter 42 stored in the proximity sensor 1 according to the embodiment will be described.

Figure 10:
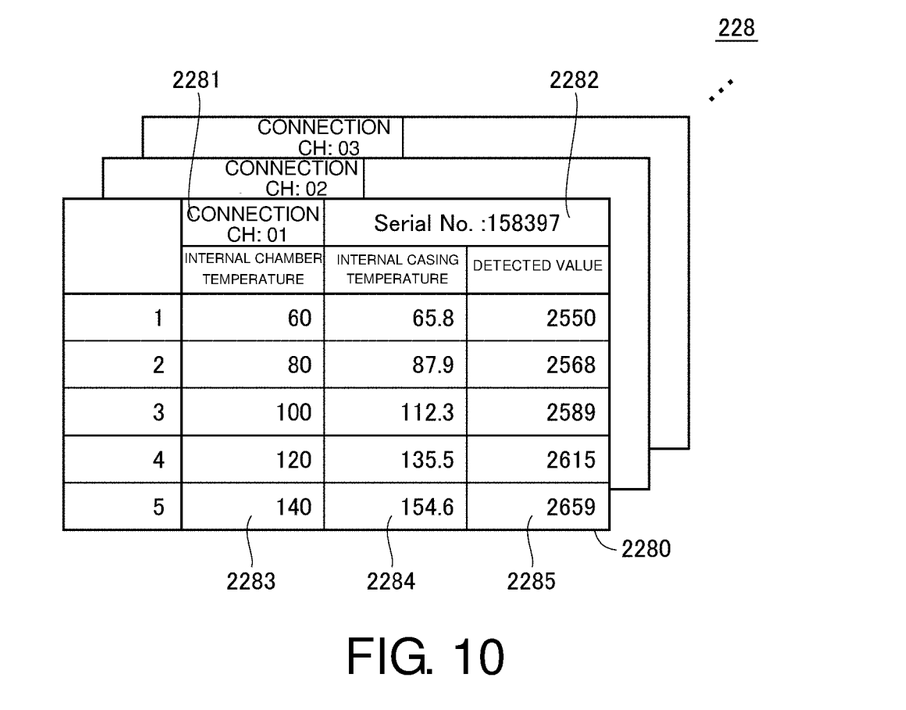
FIG. 10 is a diagram illustrating an example of a data structure of collected data stored in the setting device of a manufacturing system according to the embodiment.

FIG. 10 is a diagram illustrating an example of a data structure of collected data 228 stored in the setting device 200 of a manufacturing system 100 according to the embodiment.

Referring to FIG. 10, data collected from each proximity sensor 1 may be stored in a form of a sheet 2280 as the collected data 228. Each sheet 2280 may include a channel number 2281 indicating to which channel of the line concentrator 312 the target proximity sensor 1 is connected and an identification number 2282 collected from the target proximity sensor 1.

In the sheet 2280, results obtained by measuring the internal chamber temperature differently are sequentially stored. More specifically, the sheet 2280 has three columns, the internal chamber temperature 2283, the internal casing temperature 2284, and the detected value 2285. When the internal chamber temperature of the thermostatic chamber 300 becomes a predetermined temperature and a data collection condition is established, an internal chamber temperature, an internal casing temperature, and a detected value at that time are incorporated in one record. When a plurality of sets (records) of the internal chamber temperatures, the internal casing temperatures, and the detected values are collected, the process of collecting the data is completed. The same number of sheets 2280 as the number of the target proximity sensors 1 is generated.

The characteristic parameter 42 for each proximity sensor 1 is determined based on the collected data 228. A value of the determined characteristic parameter 42 may be stored in the corresponding sheet 2280.

Content of the sheet 2280 may be transmitted to a manufacturing management system (not illustrated) and may be used as information for managing a manufacturing situation (traceability) of each proximity sensor 1.

<F. Conclusion>

The proximity sensor 1 according to the embodiment provides a more stable sensing capability by executing the temperature correction through digital processing using the individual unique characteristic parameter 42. In proximity sensors of the related art, the temperature correction is executed in the same way using a fixed parameter. Thus, a variation in a manufacturing process or component characteristics (in particular, a variation in a temperature change in detection characteristics) results in a change in the magnitude of conductance occurring in the detection coil 16, thereby causing a change in a detection distance output in a product state. The change in the detection distance interferes in a long detectable range.

As described above, the proximity sensor 1 according to the embodiment can minimize a change factor occurring in a detection distance by adopting the unique characteristic parameter 42 and the digital processing, and thus can realize the long detectable range more easily.

In the proximity sensor 1 according to the embodiment, the temperature characteristic is individually measured in the manufacturing process and the unique characteristic parameter 42 is individually determined based on the measurement result. Further, the individually determined characteristic parameter 42 is written in the corresponding proximity sensor 1.

In the proximity sensor 1 according to the embodiment, the internal temperature sensor 38 and/or the external temperature sensor 44 may be mounted as a part of the body 2. By using the internal temperature sensor 38 or the external temperature sensor 44, temperature information can be collected more easily when the characteristic parameter for the proximity sensor 1 is determined.

By measuring an external temperature using the external temperature sensor 44, it is possible to avoid a situation in which heat a temperature measurement value is changed due to a heat source (for example, the power circuit 50) in the body 2. That is, by using the external temperature sensor 44, it is possible to reduce an influence of the heat source and measure the temperature of the detection coil 16 which is a measurement target more accurately.

In this way, the proximity sensor 1 according to the embodiment can communicate information such as temperature detected by the internal temperature sensor 38 and/or the external temperature sensor 44 with an external device.

In the proximity sensor 1 according to the embodiment, the characteristic parameter 42 is retained in a rewritable nonvolatile storage device such as EEPROM. Therefore, the characteristic parameter 42 can be rewritten easily.

In the process of manufacturing the proximity sensor 1 according to the embodiment, when the characteristic parameter 42 is determined, a measurement value or the like used for the determination can be stored in association with information for specifying the target proximity sensor 1. Therefore, it is possible to ensure traceability for each proximity sensor 1.

The embodiments disclosed herein are exemplary in all respects and are considered not to be limited. The scope of the disclosure is described in the claims rather than the above description and is intended to include all modifications within the equivalent meanings and the scope of the claims.

In an exemplary embodiment, the proximity sensor further includes an interface part configured to output a signal indicating the temperature detected by the temperature detection part to outside.

In an exemplary embodiment, the interface part receives the characteristic parameter written on the storage part.

In an exemplary embodiment, the storage part includes a rewritable nonvolatile storage device and the characteristic parameter received by the interface part is written.

In an exemplary embodiment, the temperature detection part includes a first temperature sensor disposed on a same substrate as the control calculation part and a second temperature sensor disposed at a position closer to the detection part than the first temperature sensor.

In an exemplary embodiment, the characteristic parameter is a linear coefficient.

In an exemplary embodiment, the control calculation part calculates a value equivalent to magnitude of conductance of the detection coil based on a voltage waveform occurring at both ends of the detection coil.

According to an embodiment of the disclosure, it is possible to provide a proximity sensor capable of improving detection precision or expanding a detectable range.

What is claimed is:

1. A proximity sensor that outputs presence or absence of a detection object or a position of the detection object as a detection result, the proximity sensor comprising:
    a detection part configured to include a detection coil and a capacitor;
    an oscillation circuit configured to excite the detection part;
    an analog/digital conversion circuit directly connected to a first terminal of the detection part, directly connected to a second terminal of the detection part, wherein the first terminal of the detection part and the second terminal of the detection part are different, the analog/digital conversion circuit configured to detect a signal change occurring in the detection part and output a digital signal indicating the detected signal change;
    at least one temperature sensor configured to detect a temperature inside a casing of the proximity sensor;
    a non-transitional storage memory configured to store a characteristic parameter unique to the proximity sensor in advance; and
    a control calculation circuit configured to process the digital signal from the analog/digital conversion circuit to calculate a signal indicating a distance to the detection object, compensate the calculated signal using the characteristics parameter stored in the non-transitional storage memory, and then output the compensated signal as the detection result,
    wherein the at least one temperature sensor comprises a first temperature sensor disposed on a same substrate as the control calculation circuit to measure the temperature of the control calculation circuit in order to calculate a compensation amount of the compensated signal and a second temperature sensor disposed at a position closer to the detection part than the first temperature sensor to measure the temperature of the detection part in order to reduce an influence of heat generated by the oscillation circuit, the analog/digital conversion circuit, and the control calculation circuit.

2. The proximity sensor according to claim 1, further comprising:
    an interface circuit configured to output a signal indicating the temperature detected by the at least one temperature sensor to outside.

3. The proximity sensor according to claim 2,
    wherein the interface circuit receives the characteristic parameter written on the non-transitional storage memory.

4. The proximity sensor according to claim 2,
wherein the non-transitional storage memory includes a rewritable nonvolatile storage device and the characteristic parameter received by the interface circuit is written.

5. The proximity sensor according to claim 1,
wherein the characteristic parameter is a linear coefficient.

6. The proximity sensor according to claim 1,
wherein the control calculation circuit calculates a value equivalent to magnitude of conductance of the detection coil based on a voltage waveform occurring at both ends of the detection coil.

7. The proximity sensor according to claim 3,
wherein the non-transitional storage memory includes a rewritable nonvolatile storage device and the characteristic parameter received by the interface circuit is written.

8. The proximity sensor according to claim 2,
wherein the at least one temperature sensor includes a first temperature sensor disposed on a same substrate as the control calculation circuit and a second temperature sensor disposed at a position closer to the detection part than the first temperature sensor.

9. The proximity sensor according to claim 3,
wherein the at least one temperature sensor includes a first temperature sensor disposed on a same substrate as the control calculation circuit and a second temperature sensor disposed at a position closer to the detection part than the first temperature sensor.

10. The proximity sensor according to claim 4,
wherein the at least one temperature sensor includes a first temperature sensor disposed on a same substrate as the control calculation circuit and a second temperature sensor disposed at a position closer to the detection part than the first temperature sensor.

11. The proximity sensor according to claim 2,
wherein the characteristic parameter is a linear coefficient.

12. The proximity sensor according to claim 3,
wherein the characteristic parameter is a linear coefficient.

13. The proximity sensor according to claim 4,
wherein the characteristic parameter is a linear coefficient.

14. The proximity sensor according to claim 2,
wherein the control calculation circuit calculates a value equivalent to magnitude of conductance of the detection coil based on a voltage waveform occurring at both ends of the detection coil.

15. The proximity sensor according to claim 3,
wherein the control calculation circuit calculates a value equivalent to magnitude of conductance of the detection coil based on a voltage waveform occurring at both ends of the detection coil.

16. The proximity sensor according to claim 4,
wherein the control calculation circuit calculates a value equivalent to magnitude of conductance of the detection coil based on a voltage waveform occurring at both ends of the detection coil.

17. The proximity sensor according to claim 5,
wherein the control calculation circuit calculates a value equivalent to magnitude of conductance of the detection coil based on a voltage waveform occurring at both ends of the detection coil.

* * * * *